United States Patent
Wan et al.

(10) Patent No.: US 10,879,197 B2
(45) Date of Patent: Dec. 29, 2020

(54) PACKAGE STRUCTURE AND METHOD OF FABRICATING PACKAGE STRUCTURE

(71) Applicant: Taiwan Semiconductor Manufacturing Co., Ltd., Hsinchu (TW)

(72) Inventors: Albert Wan, Hsinchu (TW); Chung-Shi Liu, Hsinchu (TW); Chao-Wen Shih, Hsinchu County (TW); Han-Ping Pu, Taichung (TW); Chien-Ling Hwang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 22 days.

(21) Appl. No.: 15/690,287

(22) Filed: Aug. 30, 2017

(65) Prior Publication Data

US 2019/0067220 A1 Feb. 28, 2019

(51) Int. Cl.
*H01L 23/495* (2006.01)
*H01L 23/04* (2006.01)
(Continued)

(52) U.S. Cl.
CPC ............ *H01L 23/66* (2013.01); *H01L 21/565* (2013.01); *H01L 21/6835* (2013.01);
(Continued)

(58) Field of Classification Search
CPC .......... H05K 1/181; H05K 3/10; H05K 3/303; H05K 3/4007; H05K 1/0218; H05K 1/141; H05K 2201/09227; H05K 2201/042; H05K 2201/045; H05K 2201/1003; H05K 2201/10098; H05K 2201/10962; H05K 2201/2036; H03H 7/0138; H01L 21/56; H01L 23/12; H01L 23/15; H01L 23/28; H01L 23/49827; H01L 23/3107; H01L 23/5386; H01L 23/5389; H01L 23/552

See application file for complete search history.

(56) References Cited

U.S. PATENT DOCUMENTS

| 7,394,663 B2 * | 7/2008 | Yamashita ........ H01L 23/49894 257/E23.077 |
| 9,000,584 B2 | 4/2015 | Lin et al. |

(Continued)

*Primary Examiner* — Mary A Wilczewski
*Assistant Examiner* — Tsz K Chiu
(74) *Attorney, Agent, or Firm* — JCIPRNET

(57) ABSTRACT

A package structure in accordance with some embodiments may include an RFIC chip, a redistribution circuit structure, a backside redistribution circuit structure, an isolation film, a die attach film, and an insulating encapsulation. The redistribution circuit structure and the backside redistribution circuit structure are disposed at two opposite sides of the RFIC chip and electrically connected to the RFIC chip. The isolation film is disposed between the backside redistribution circuit structure and the RFIC chip. The die attach film is disposed between the RFIC chip and the isolation film. The insulating encapsulation encapsulates the RFIC chip and the isolation film between the redistribution circuit structure and the backside redistribution circuit structure. The isolation film may have a coefficient of thermal expansion lower than the insulating encapsulation and the die attach film.

22 Claims, 11 Drawing Sheets

(51) Int. Cl.
*H01L 23/66* (2006.01)
*H01L 23/31* (2006.01)
*H01L 23/00* (2006.01)
*H01L 21/683* (2006.01)
*H01L 21/56* (2006.01)
*H01L 23/48* (2006.01)
*H01L 23/29* (2006.01)
*H01L 23/26* (2006.01)
*H01L 23/16* (2006.01)

(52) U.S. Cl.
CPC ........ *H01L 23/3135* (2013.01); *H01L 23/481* (2013.01); *H01L 24/13* (2013.01); *H01L 24/19* (2013.01); *H01L 24/20* (2013.01); *H01L 24/32* (2013.01); *H01L 24/73* (2013.01); *H01L 24/83* (2013.01); *H01L 21/568* (2013.01); *H01L 23/16* (2013.01); *H01L 23/26* (2013.01); *H01L 23/291* (2013.01); *H01L 23/293* (2013.01); *H01L 23/3128* (2013.01); *H01L 23/3142* (2013.01); *H01L 24/11* (2013.01); *H01L 2221/68345* (2013.01); *H01L 2221/68359* (2013.01); *H01L 2223/6677* (2013.01); *H01L 2224/023* (2013.01); *H01L 2224/024* (2013.01); *H01L 2224/0231* (2013.01); *H01L 2224/02372* (2013.01); *H01L 2224/02379* (2013.01); *H01L 2224/11002* (2013.01); *H01L 2224/13024* (2013.01); *H01L 2224/18* (2013.01); *H01L 2224/211* (2013.01); *H01L 2224/221* (2013.01); *H01L 2224/28105* (2013.01); *H01L 2224/32225* (2013.01); *H01L 2224/73217* (2013.01); *H01L 2224/73265* (2013.01); *H01L 2924/1203* (2013.01); *H01L 2924/1304* (2013.01); *H01L 2924/1421* (2013.01); *H01L 2924/3511* (2013.01)

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,930,783 | B2* | 3/2018 | Zuo ..................... H01L 23/3107 |
| 10,629,519 | B2* | 4/2020 | Chen ................... H01L 21/6835 |
| 10,763,217 | B2* | 9/2020 | Lee ......................... H01L 23/66 |
| 2004/0056344 | A1* | 3/2004 | Ogawa .................... H01L 25/50 257/686 |
| 2004/0178508 | A1* | 9/2004 | Nishimura .......... H01L 23/3128 257/778 |
| 2006/0290512 | A1* | 12/2006 | Shanton ........... G06K 19/07749 340/572.7 |
| 2008/0217708 | A1* | 9/2008 | Reisner ............... H01L 23/3121 257/416 |
| 2009/0008765 | A1* | 1/2009 | Yamano .................. H01L 24/83 257/690 |
| 2009/0129037 | A1* | 5/2009 | Yoshino ................. H05K 1/186 361/761 |
| 2011/0193203 | A1* | 8/2011 | Goto ................... H01L 23/5389 257/659 |
| 2014/0091440 | A1* | 4/2014 | Nair .................... H01L 23/5383 257/659 |
| 2017/0062357 | A1* | 3/2017 | Kamgaing .............. H01Q 1/2283 |
| 2018/0034134 | A1* | 2/2018 | Dalmia ..................... H01Q 5/49 |
| 2018/0151478 | A1* | 5/2018 | Chen ....................... H01L 23/04 |
| 2018/0233457 | A1* | 8/2018 | Chen ................... H01L 23/3107 |
| 2018/0337148 | A1* | 11/2018 | Baek ....................... H01L 23/66 |

* cited by examiner

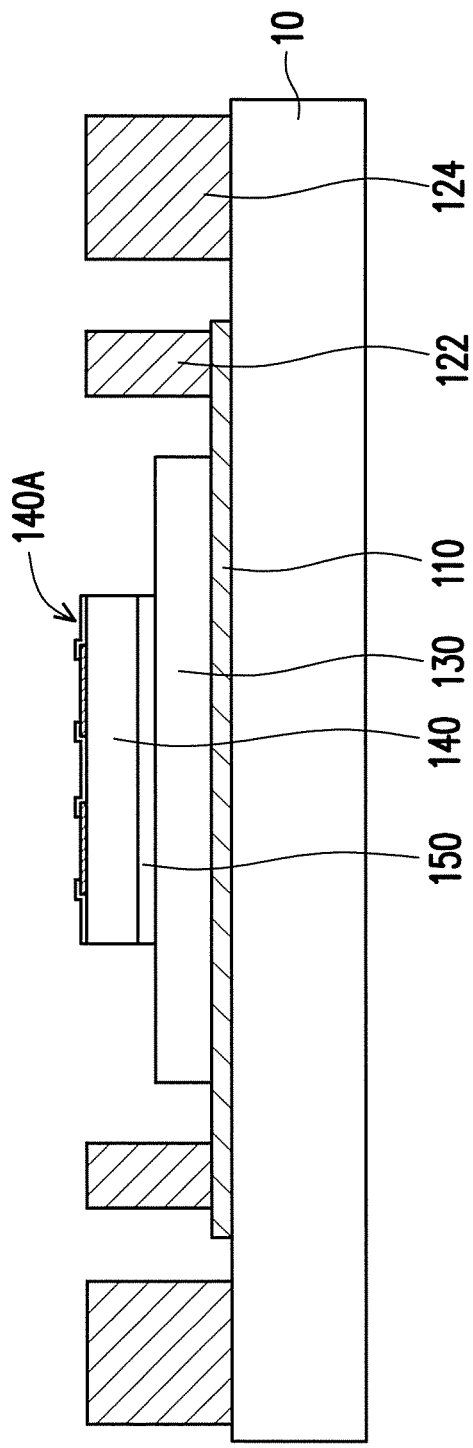
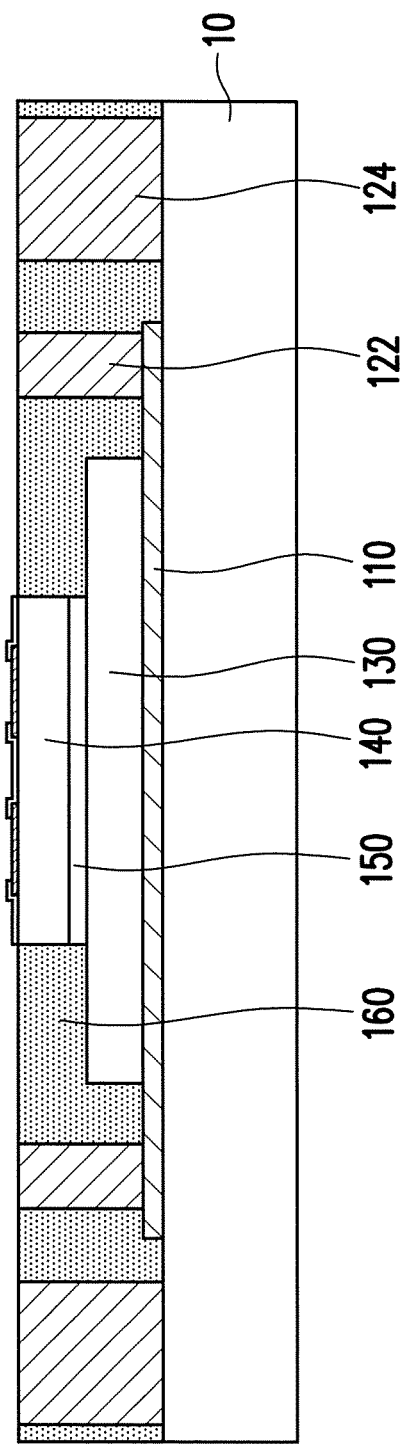

PACKAGE STRUCTURE AND METHOD OF FABRICATING PACKAGE STRUCTURE

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, a technique of integrated fan-out (InFO) packages having more compactness is developed and utilized in various package applications.

For example, the InFO package is utilized for packaging a radio frequency integrated circuit (RFIC) chip with an integrated antenna. However, the performance of the integrated antenna still need to be improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 10 schematically illustrate exemplarily process of the method of fabricating a package structure in accordance with some embodiments.

DETAILED DESCRIPTION

Figure 1:
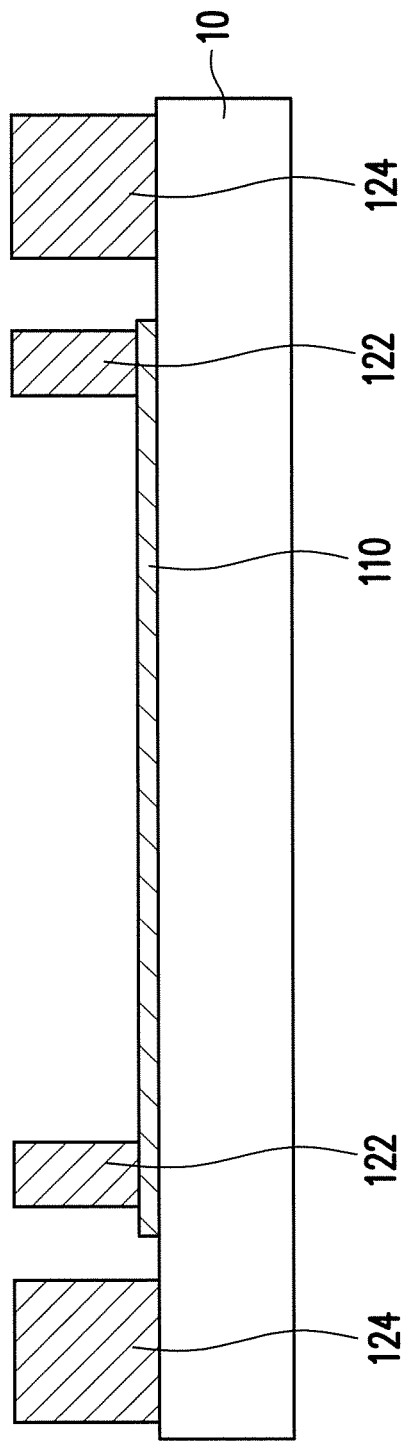

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 schematically illustrate a process of the method of fabricating a package structure in accordance with some embodiments of the disclosure. Referring to FIG. 1, a backside redistribution circuit structure 110 is fabricated on a carrier 10. In some embodiments, the carrier 10 may be a substrate with sufficient rigidity or stiffness for providing a solid stand for the subsequent process. The carrier 10 may be, but not limited to a glass substrate. In some embodiments, the carrier 10 may be removed from the device formed thereon so as to finish the final device and thus a temporary adhesive layer not shown may be formed on the carrier 10 for connecting the backside redistribution circuit structure 110 and the carrier 10 during fabrication. In some embodiments, the backside redistribution circuit structure 110 may be directly and immediately fabricated on the carrier 10 without using a temporary adhesive layer. For example, a metal layer (not shown) may be immediately formed on the carrier 10 through chemical vapor deposition (CVD), physical vapor deposition (PVD), atomic layer deposition (ALD), high density plasma CVD (HDPCVD), plating, other suitable methods, and/or combinations thereof and thereafter, the metal layer may be patterned to form the backside redistribution circuit structure 110. Accordingly, a pre-metal dielectric layer such as the temporary adhesive layer may be omitted. The material of the metal layer may include titanium, tungsten, aluminum, copper, metal alloys, metal silicide, other suitable materials, and/or combinations thereof.

In some embodiments, a through via 122 and a lateral antenna structure 124 may be formed on the carrier 10. The through via 122 may be disposed on and connected to the backside redistribution circuit structure 110. The lateral antenna structures 124 may be located beside the backside redistribution circuit structure 110. In some embodiments, the through via 122 and the lateral antenna structure 124 may be fabricated by the following process. A pattern defining layer (not shown) having openings with predetermined depths may be formed on the carrier 10 and the backside redistribution circuit structure 110. The openings of the pattern defining layer may expose a portion of the backside redistribution circuit structure 110 and the carrier 10. Subsequently, a conductive material fills into the openings of the pattern defining layer to form the through via 122 and the lateral antenna structure 124 by chemical vapor deposition (CVD), physical vapor deposition (PVD), atomic layer deposition (ALD), high density plasma CVD (HDPCVD), plating, other suitable methods, and/or combinations thereof. The conductive material includes, for example, titanium, tungsten, aluminum, copper, metal alloys, metal silicide, other suitable materials, and/or combinations thereof. In some embodiment, the thickness of the pattern defining layer may be determined based on the required height of the through via 122. Subsequent to the formation of the through via 122 and the lateral antenna structure 124, the pattern defining layer is removed such that the structure as shown in FIG. 1 is achieved.

Figure 2:
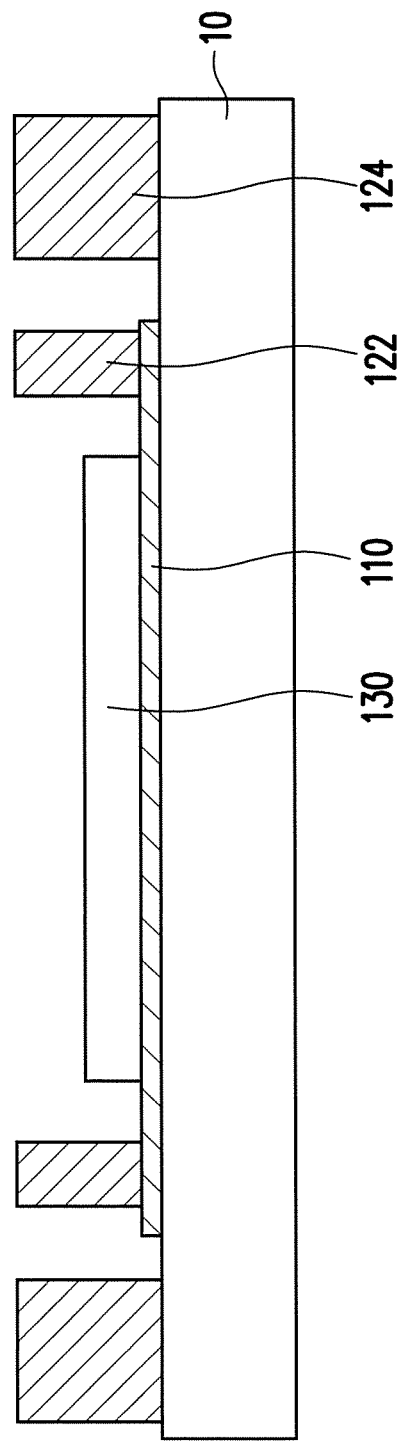

As shown in FIG. 2, an isolation film 130 is laminated on the backside redistribution circuit structure 110. The isolation film 130 may be made of a pre-preg material in some embodiments. In some alternative embodiments, a material of the isolation film 130 may include at least one of fused quartz, polycarbonate, polystyrene, Teflon, and Tefzel. The isolation film 130 may have a predetermined size and shape to be laminated on the backside redistribution circuit structure 110 without covering the through via 122. The thickness of the isolation film 130 may be smaller than the height of the through via 122. In some embodiments, the thickness of the isolation film 130 may be 60 µm-120 µm, 80 µm, 100 µm, or the like that can keep the antenna from disturbing from the Si chip.

In some embodiment, the isolation film 130 may have low dielectric loss tangent. For example, the dissipation factor (Df) of the isolation film 130 may be not greater than 0.01. In a case the isolation film 130 is made of a prepreg material, the dissipation factor (Df) of the isolation film 130 may be 0.007. In a case the isolation film 130 is made of fused quartz, the dissipation factor (Df) of the isolation film 130 may be 0.008 at 100 MHz or at 3 GHz. In a case the isolation film 130 is made of polycarbonate, the dissipation factor (Df) of the isolation film 130 may be 0.000660-0.0100. In a case the isolation film 130 is made of polystyrene, the dissipation factor (Df) of the isolation film 130 may be 0.0001 at 100 MHz or 0.00033 at 3 GHz. In a case the isolation film 130 is made of Teflon, the dissipation factor (Df) of the isolation film 130 may be 0.00028 at 3 GHz. In a case the isolation film 130 is made of Tefzel, the dissipation factor (Df) of the isolation film 130 may be 0.0007 to 0.0119. In some alternative embodiments, the isolation film 130 may have a small coefficient of thermal expansion. For example, the coefficient of thermal expansion of the isolation film 130 may be smaller than 10 ppm/° C., or not greater than 5 ppm/° C. In the case the isolation film 130 is made of prepreg material, the coefficient of thermal expansion of the isolation film 130 may be 4.5 ppm/° C.

Next, in FIG. 3, a radio frequency integrated circuit (RFIC) chip 140 is picked up and placed on the isolation film 130. The RFIC chip 140 is attached on the isolation film 130 in a manner the active surface of the first side 140A facing upwards as oriented in this illustrative example. The RFIC chip 140 may include semiconductor devices or integrated circuits that have been previously manufactured on a semiconductor substrate. The RFIC chip 140 may include one or more layers of electrical circuitry and/or electronic functions formed thereon, and may include conductive lines, vias, capacitors, diodes, transistors, resistors, inductors, and/or other electrical components, for example (not shown). In some embodiments, an area of the isolation film 130 may exceed an area of the RFIC chip 140, so that the RFIC chip 140 may be carried and supported by the isolation film 130. In some alternative embodiments, an area of the isolation film 130 may be similar or substantially identical to an area of the RFIC chip 140. For example, an area of the isolation film 130 may be 1 to 1.5 or more times of the area of the RFIC chip 140.

In some embodiments, the RFIC chip 140 is attached onto the isolation film 130 by using a die attach film 150. A material of the die attach film 150 may include a thermoplastic material, such as epoxy resin, phenol resin, or polyolefin, as examples, although alternatively, other thermoplastic materials or polymers compatible with semiconductor processing environments may be used. The die attach film 150 may be formed on the isolation film 130 using a lamination process and may have a thickness of about 10 µm for example. Alternatively, the die attach film 150 may be applied by other techniques and may have other dimensions. In some embodiments, the dissipation factor (Df) of the isolation film 130 may be smaller than that of the die attach film 150. Alternatively, the coefficient of thermal expansion of the isolation film 130 may be smaller than that of the die attach film 150. In some other embodiments, a thickness of the die attach film 150 may be smaller than the thickness of the isolation film 130. For example, in some embodiments, the dissipation factor (Df) of the die attach film 150 may be 0.003 at 1 MHz. A thickness of the die attach film 150 may be smaller than a thickness of the isolation film 130. For example, the thickness of the die attach film 150 may be around 10 µm and the thickness of the isolation film 130 may be around 100 µm in some embodiments.

Subsequent to the attachment of the RFIC chip 140 onto the isolation film 130 through the die attach film 150, an insulating encapsulation 160 is formed to encapsulate the RFIC chip 140, the isolation film 130, the lateral antenna structure 124 and the through via 122 as shown in FIG. 4. A material of the insulating encapsulation 160 may be a resin capable of being cured through a thermal cure process or UV cure process. In some embodiments, the isolation film 130 is thick and exceeds the area of the RFIC chip 140 so that the amount of the resin for forming the insulating encapsulation 160 may be reduced to save the fabrication cost. In some embodiments, the dissipation factor (Df) of the isolation film 130 may be smaller than that of the insulating encapsulation 160. In some embodiments, the coefficient of thermal expansion of the isolation film 130 may be smaller than that of the insulating encapsulation 160. For example, the dissipation factor (Df) of the insulating encapsulation 160 may be 0.015 at 60 GHz.

Figure 5:
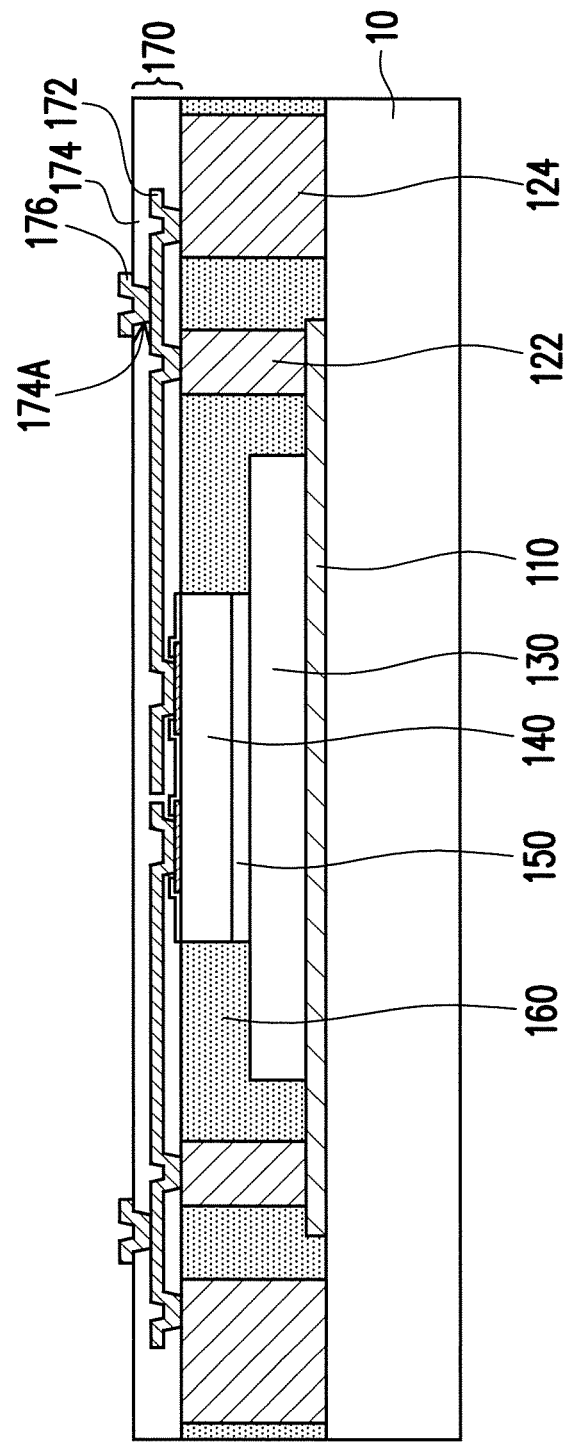

In FIG. 5, a redistribution circuit structure 170 connected to the RFIC chip 140 is formed on the insulating encapsulation 160. The redistribution circuit structure 170 may include at least one metal layer 172 forming conductive traces distributed in at least one dielectric layer 174 and at least one connecting pad 176 forming on the dielectric layer 174. The dielectric layer 174 may be disposed between the connecting pad 176 and the metal layer 172. In some embodiments, the conductive traces of the metal layer 172 may provide a predetermined layout for mapping the electrical conduction paths of the RFIC chip 140, the through via 122 and the lateral antenna structure 124. The RFIC chip 140, the through via 122 and the lateral antenna structure 124 are electrically connected to the redistribution circuit structure 170. In some embodiments, the redistribution circuit structure 170 may be electrically connected to the backside redistribution circuit structure 110 through the through via 122.

Figure 6:
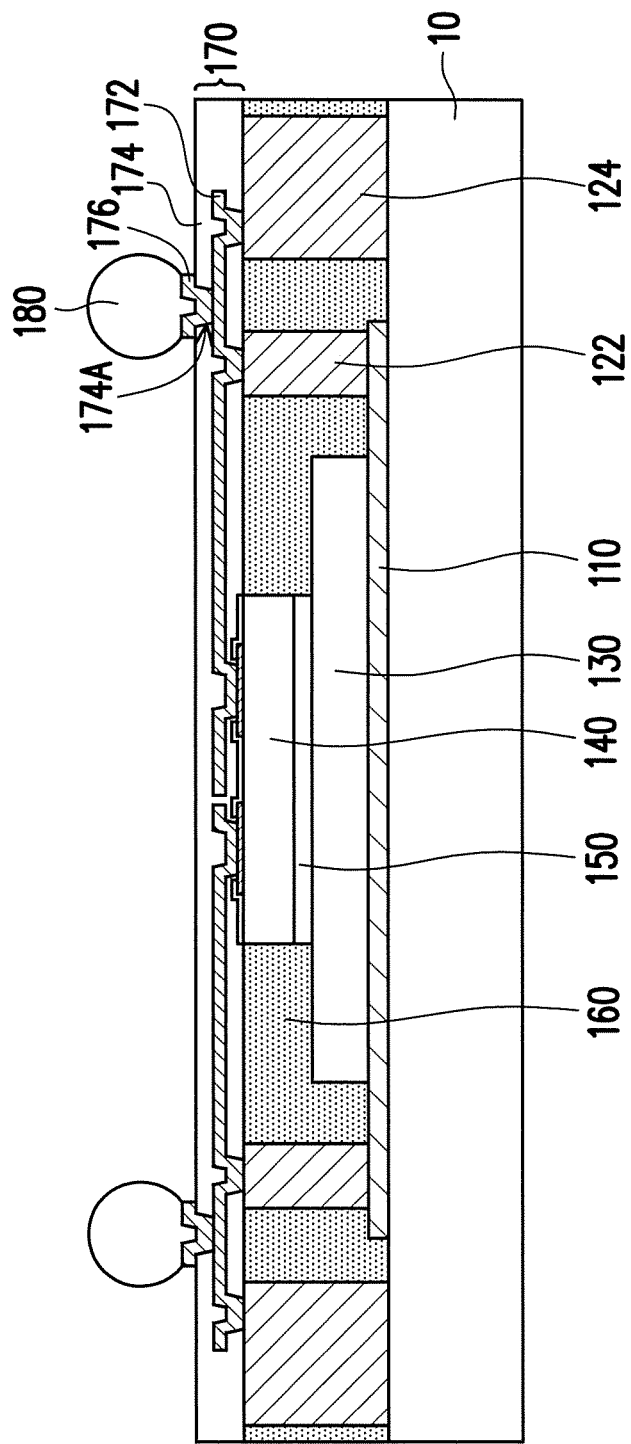

As shown in FIG. 6, a conductive bump 180 may be formed on the connecting pad 176 for bonding to an external component such as a circuit board. The conductive bump 180 may be a controlled collapsing chip connector ("C4"), a solder bump, or other connector capable of connecting the redistribution circuit structure 170 to an external device. In some alternative embodiments, the connecting pad 176 may be omitted, the dielectric layer 174 may have an opening 174A and the conductive bump 180 may be in direct connected to the conductive traces (not shown) of the metal layer 172 in the opening 174A.

Figure 7:
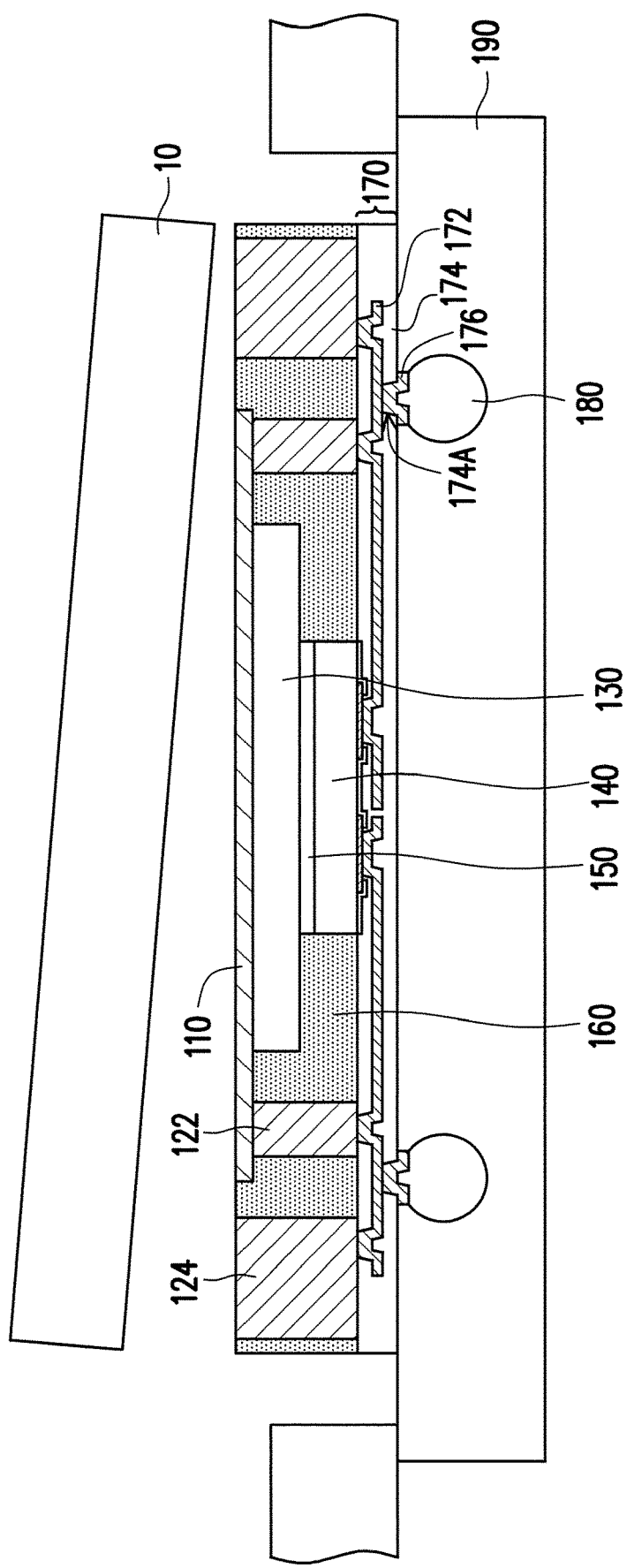

Next, as shown in FIG. 7, the structure fabricated by performing the steps of FIGS. 1 to 6 is mounted on a support frame 190 and a debonding process is performed to remove the carrier 10 from the backside redistribution circuit structure 110. In some embodiments, the debonding process may include applying an energy beam to the boundary between the carrier 10 and the backside redistribution circuit structure 110. After removing the carrier 10, the backside redistribution circuit structure 110 and a portion of the insulating encapsulation 160 may be exposed.

Figure 8:
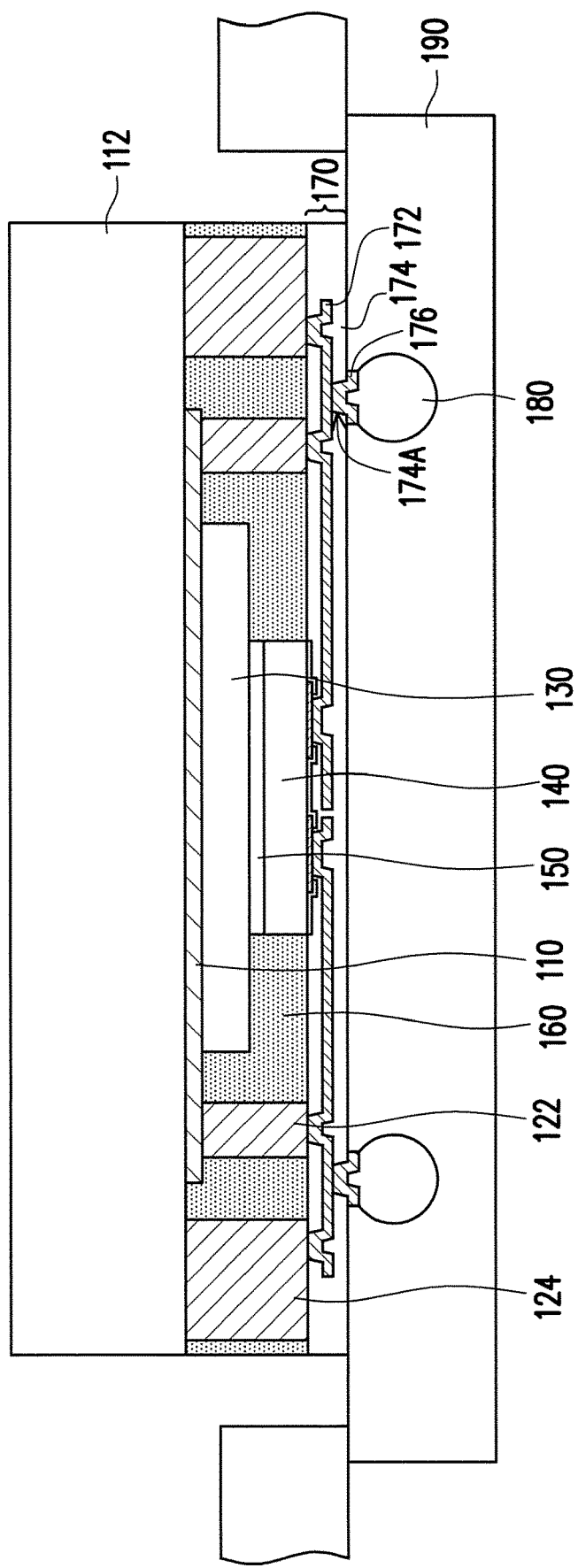

In FIG. 8, an isolation molding layer 112 is laminated on the backside redistribution circuit structure 110 and the insulating encapsulation 160. The isolation molding layer 112 may cover the backside redistribution circuit structure 110 and the lateral antenna structures 124. A material of the isolation molding layer 112 may be dielectric material allowing the microwave to pass it through. In some embodiments, the isolation molding layer 112 may have a low dielectric loss tangent. In some alternative embodiments, a material of the isolation molding layer 112 may be a resin capable of being cured through a thermal cure process or UV cure process. In some further embodiments, a material of the isolation molding layer 112 may be identical to that of the isolation film 130.

Figure 9:
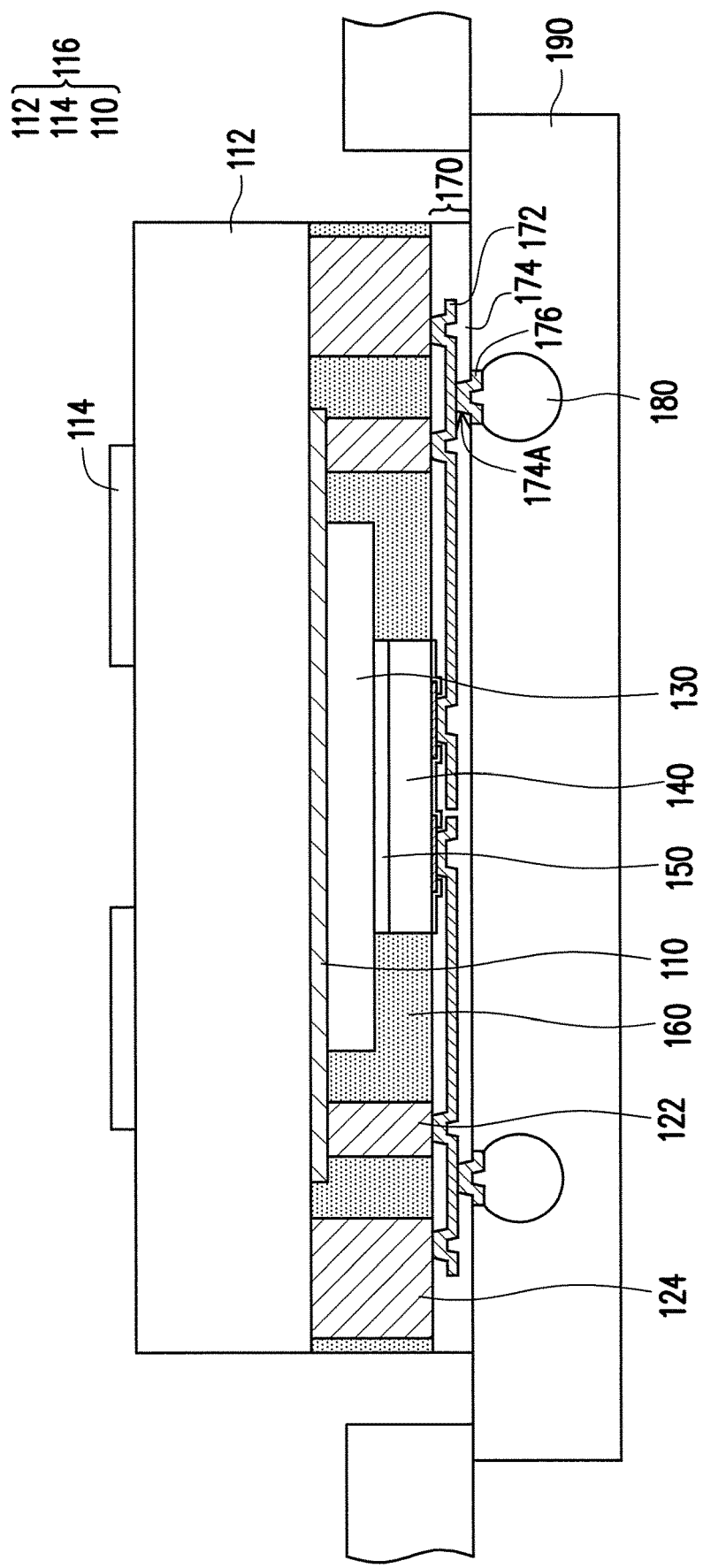

In FIG. 9, a plurality of antenna patches 114 are formed on the isolation molding layer 112 over the backside redistribution circuit structure 110, such that the antenna patches 114, the isolation molding layer 112 and the backside redistribution circuit structure 110 construct an antenna structure 116. In some embodiment, the structures and patterns of the antenna patches 114 may be determined based on the product design requirements. In some embodiments, a metal layer is formed on the isolation molding layer 112 by chemical vapor deposition (CVD), physical vapor deposition (PVD), atomic layer deposition (ALD), high density plasma CVD (HDPCVD), other suitable methods, and/or combinations thereof and the metal layer is patterned to form the antenna patches 114.

Figure 10:
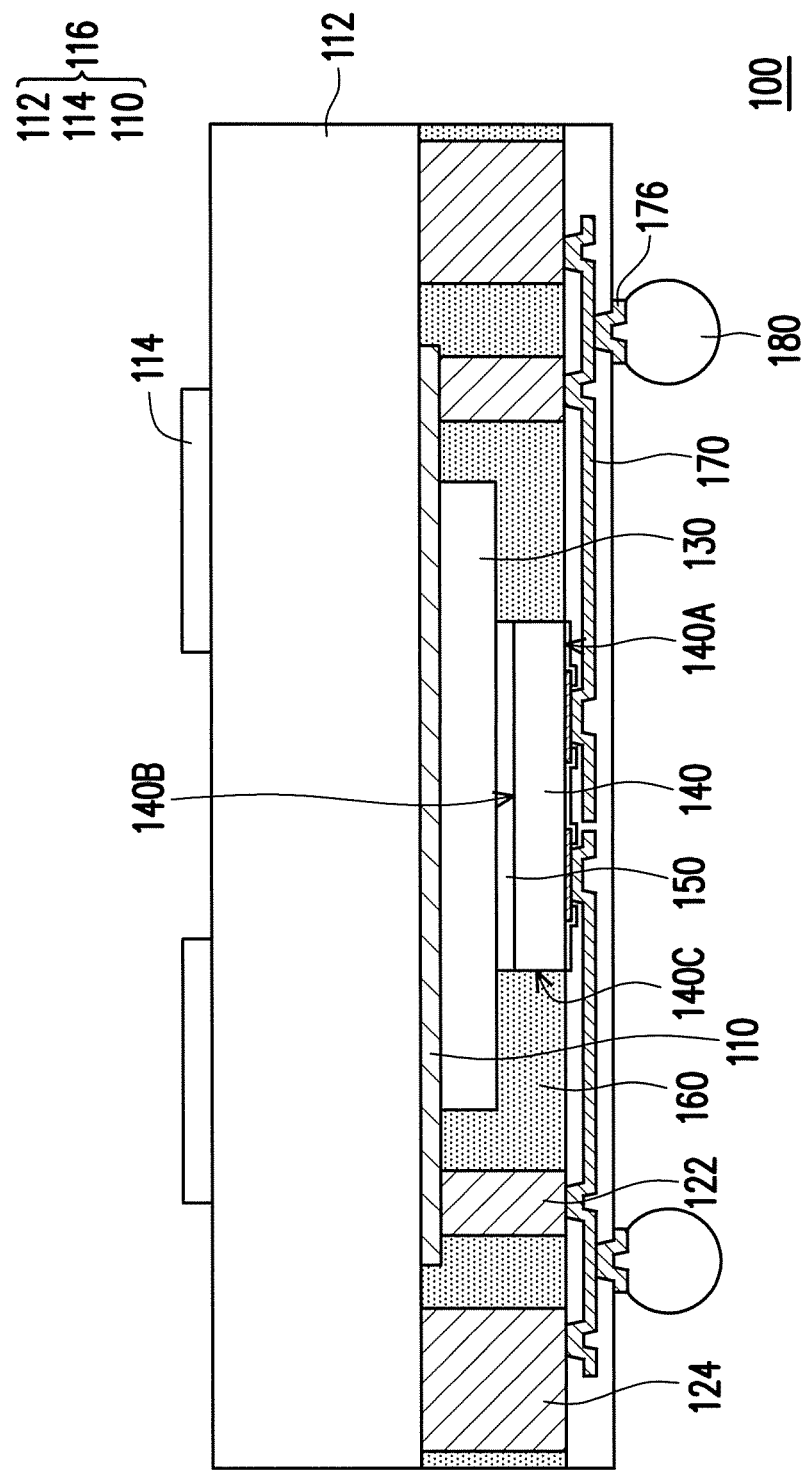

In addition, as shown in FIG. 10, the support frame 190 is removed so that a package structure 100 is fabricated. The package structure 100 at least includes an RFIC chip 140, a redistribution circuit structure 170, a backside redistribution circuit structure 110, an isolation film 130, a die attach film 150, and an insulating encapsulation 160. The redistribution circuit structure 170 is disposed at a first side 140A of the RFIC chip 140 and electrically connected to the RFIC chip 140. The backside redistribution circuit structure 110 is disposed at a second side 140B of the RFIC chip 140 and electrically connected to the RFIC chip 140 through the through via 122 and the redistribution circuit structure 170. The first side 140A is opposite to the second side 140B and the first side 140A may be the side of the active surface of the RFIC chip 140. The isolation film 130 is disposed between the backside redistribution circuit structure 110 and the RFIC chip 140. The die attach film 150 is disposed between the RFIC chip 140 and the isolation film 130. The die attach film 150 may be used for attaching the RFIC chip 140 onto the isolation film 130. The insulating encapsulation 160 encapsulates the RFIC chip 140 and the isolation film 130 between the redistribution circuit structure 170 and the backside redistribution circuit structure 110. In addition, the package structure 100 may further include the isolation molding layer 112 and the antenna patches 114 so that an antenna structure 116 including the backside redistribution circuit structure 110, the isolation molding layer 112 and the antenna patches 114 is disposed on the insulating encapsulation 160.

Figure 11:
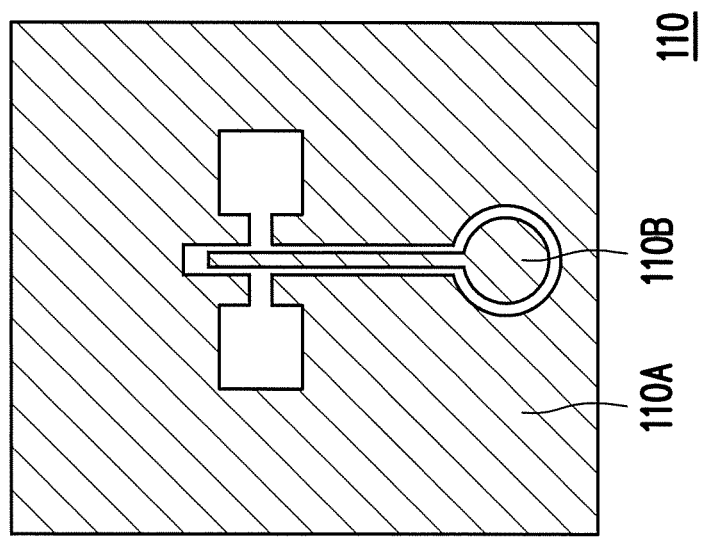
FIG. 11 schematically illustrates a top view of the backside redistribution circuit structure in accordance with some embodiments.

In the antenna structure 116, the isolation molding layer 112 is disposed between the backside redistribution circuit structure 110 and the antenna patches 114. FIG. 11 schematically illustrates a top view of the backside redistribution circuit structure. As shown in FIG. 10 and FIG. 11, in some embodiments, the backside redistribution circuit structure 110 may include a ground plane 110A and a feed line 110B that are formed of a metal layer. The ground plane 110A and the feed line 110B may be connected to the redistribution circuit structure 170 through the through via 122 shown in FIG. 10. The feed line 110B may be electrically coupled to the antenna patches 114. Accordingly, the antenna structure 116 may be electrically connected to the RFIC chip 140 through the through via 122 and the redistribution circuit structure 170. In some embodiments, the metal layer (the ground plane 110A and the feed line 110B) of the backside redistribution circuit structure 110 may be in contact with the isolation molding layer 112 without an interposing layer between the metal layer (the ground plane 110A and the feed line 110B) of the backside redistribution circuit structure 110 and the isolation molding layer 112.

Figure 12:
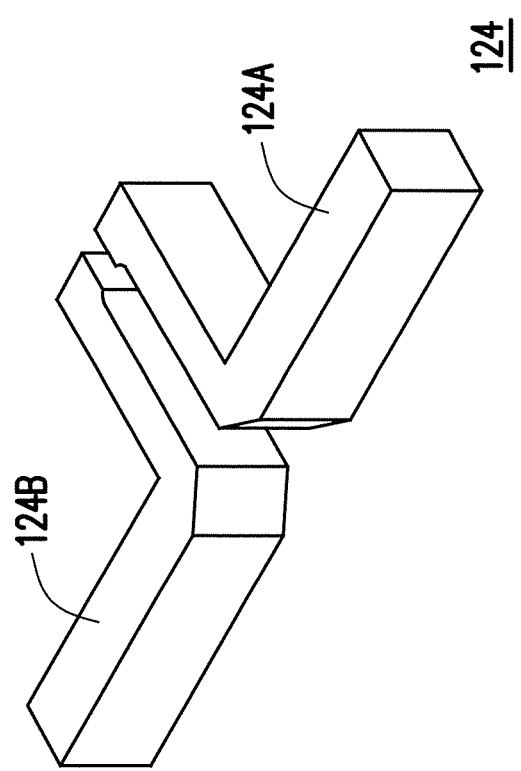
FIG. 12 schematically illustrates a perspective view of the lateral antenna structure in accordance with some embodiments.

As shown in FIG. 10, the lateral antenna structure 124 may further be disposed at the lateral side 140C of the RFIC chip 140 and encapsulated by the insulating encapsulation 160. Accordingly, the package structure 100 may include a plurality of integrated antennas located at the second side 140B and the lateral side 140C of the RFIC chip 140. In some embodiments, the lateral antenna structure 124 may be electrically connected to the RFIC chip 140 through the redistribution circuit structure 170 and located at the periphery of the package structure 100 as shown in FIG. 10. FIG. 12 schematically illustrates a perspective view of the lateral antenna structure. As shown in FIG. 10 and FIG. 12, the lateral antenna structure 124 encapsulated by the insulating encapsulation 160 may be a dipole antenna consisting of two identical conductive elements 124A and 124B that are bilaterally symmetrically arranged, but the disclosure is not limited thereto.

Referring to FIG. 10, a material of the isolation film 130 may include a pre-preg material. In some embodiments, a material of the isolation film 130 may include at least one of fused quartz, polycarbonate, polystyrene, Teflon, and Tefzel. The isolation film 130 may have a coefficient of thermal expansion lower than the insulating encapsulation 160 and the die attach film 150. The heat generated during the operation of the RFIC chip 140 may not cause an obvious volume change of the isolation film 130, such that a warpage of the package structure 100 may be mitigated or prevented. In some alternative embodiments, the isolation film 130 has a thickness greater than the die attach film 150 so that the RFIC chip 140 and the antenna structure 116 may be separated by a sufficient distance to prevent from signal interference between the RFIC chip 140 and the antenna structure 116. In an example, the thickness of the isolation film 130 may be 80 μm, 100 μm, 120 μm, or the like. A thickness of the isolation film 130 may be the same as a thickness of the RFIC chip 140. In some further embodiments, the isolation film 130 may have a low dielectric loss tangent. The dissipation factor (Df) of the isolation film 130 may be lower than that of the insulating encapsulation 160 and the die attach film 150. In some embodiments, the dissipation factor (Df) of the isolation film 130 may be lower than 0.01. The transmission quality of the antenna structure 116 may be improved and the power consumption of the operation of the antenna structure 116 may be reduced. Accordingly, the antenna structure 116 may have enhanced operation efficiency.

In some embodiment, the RFIC chip 140 may include an integrated electrical circuit operating in a frequency range suitable for wireless transmission. As shown in FIG. 10, the RFIC chip 140 may be electrically connected to the lateral antenna structure 124 through the redistribution circuit structure 170 and electrically connected to the antenna structure 116 through the redistribution circuit structure 170 and the through via 122. Accordingly, the lateral antenna structure 124 and the antenna structure 116 may generate an electromagnetic wave such as a microwave or receive a microwave from an external for the wireless communication function. In addition, the conductive bump 180 may be electrically connected to the RFIC chip 140 through the redistribution circuit structure 170, such that the RFIC chip 140 can be electrically connected to an external device through the conductive bump 180.

The insulating encapsulation 160 encapsulates the RFIC chip 140, the isolation film 130, the through via 122 and the lateral antenna structure 124. The insulating encapsulation 160 may fill the spaces among the RFIC chip 140, the isolation film 130, the through via 122 and the lateral antenna structure 124 so as to seal the RFIC chip 140, the isolation film 130, the through via 122 and the lateral antenna structure 124. A material of the insulating encapsulation 160 may be a resin capable of being cured through a thermal cure process or UV cure process.

Figure 13:
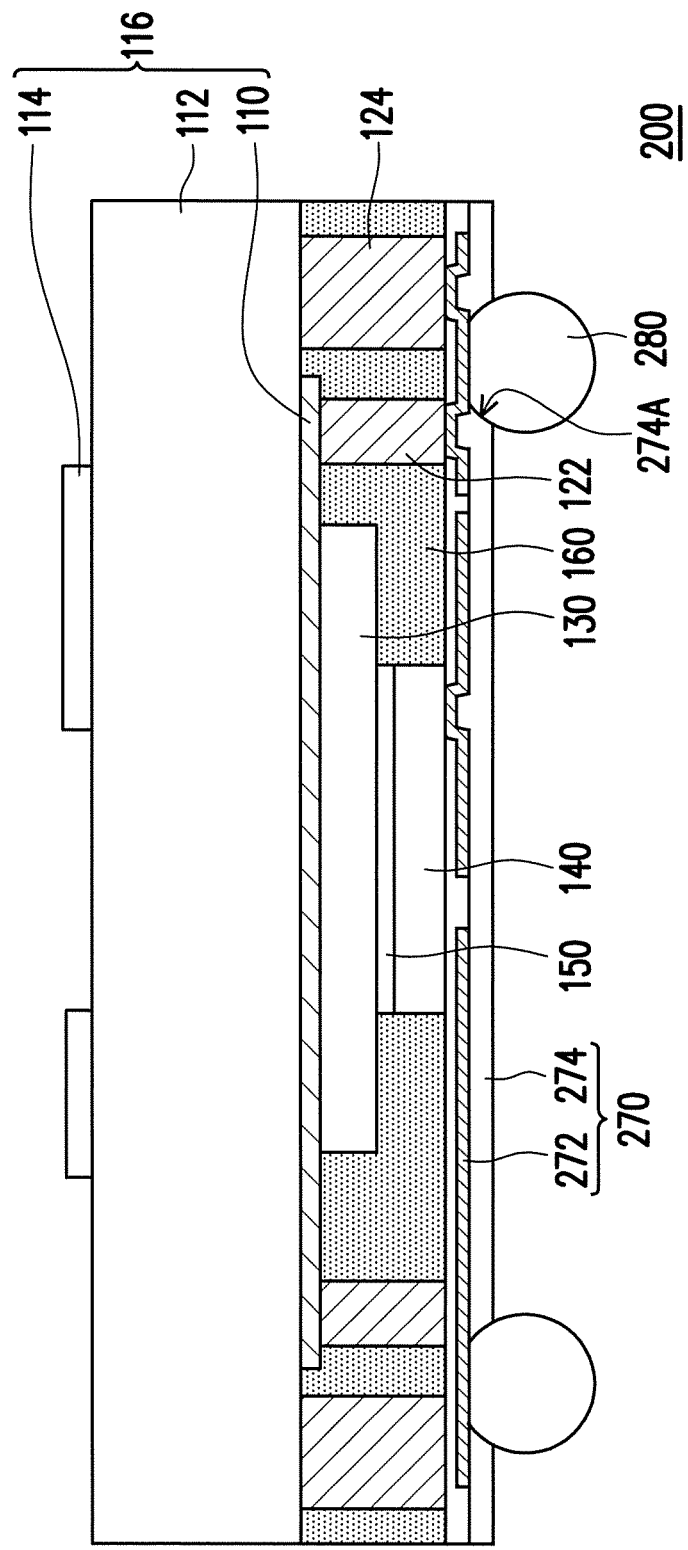
FIG. 13 schematically illustrates a package structure in accordance with some embodiments.

FIG. 13 schematically illustrates a package structure in accordance with some embodiments. In FIG. 13, a package structure 200 at least includes an RFIC chip 140, a redistribution circuit structure 270, an antenna structure 116, an isolation film 130, a die attach film 150, an insulating encapsulation 160, and a conductive bump 180. The redistribution circuit structure 270 and the isolation film 130 are disposed at two opposite sides of the RFIC chip 140 and the RFIC chip 140 is attached to the isolation film 130 through the die attach film 150. The insulating encapsulation 160 encapsulates the RFIC chip 140 and the isolation film 130 between the antenna structure 116 and the redistribution circuit structure 270. In addition, the package structure 200 may further include a through via 122 and a lateral antenna structure 124 encapsulated by the insulating encapsulation 160. The through via 122 is disposed between the antenna structure 116 and the redistribution circuit structure 270 so that the antenna structure 116 may be electrically connected to the RFIC chip 140 through the through via 122 and the redistribution circuit structure 270. The lateral antenna structure 124 may be disposed at the lateral side of the RFIC chip 140, so that the package structure 100 may include a plurality of integrated antennas located at the second side 140B and the lateral side 140C of the RFIC chip 140.

The antenna structure 116 may include a backside redistribution circuit structure 110, an isolation molding layer 112 and a plurality of antenna patches 114. The backside redistribution circuit structure 110 may be disposed on the insulating encapsulation 160 and the isolation film 130 and electrically connected to the RFIC chip 140 through the through via 122 and the redistribution circuit structure 270. The isolation molding layer 112 may be disposed between the backside redistribution circuit structure 110 and the antenna patches 114. In some embodiments, a metal layer of the backside redistribution circuit structure 110 may be in contact with the isolation molding layer 112 without an interposing layer between the metal layer of the backside redistribution circuit structure 110 and the isolation molding layer 112.

In some embodiments, a material of the isolation film 130 may include a pre-preg material. In some alternative embodiments, a material of the isolation film 130 may include at least one of fused quartz, polycarbonate, polystyrene, Teflon, and Tefzel. The isolation film 130 may have a coefficient of thermal expansion lower than the insulating encapsulation 160 and the die attach film 150. In some alternative embodiments, the isolation film 130 has a thickness greater than the die attach film 150 so that the RFIC chip 140 and the antenna structure 116 may be separated by a sufficient distance to prevent from signal interference between the RFIC chip 140 and the antenna structure 116. In an example, the thickness of the isolation film 130 may be 80 µm, 100 µm, 120 µm, or the like. In some other embodiments, the isolation film 130 may have a low dielectric loss tangent. The dissipation factor (Df) of the isolation film 130 may be lower than that of the insulating encapsulation 160 and the die attach film 150. For example, the dissipation factor (Df) of the isolation film 130 may be lower than 0.01. Accordingly, the antenna structure 116 may have enhanced efficiency.

The RFIC chip 140 attached to the isolation film 130 through the die attach film 150 may include an integrated electrical circuit operating in a frequency range suitable for wireless transmission. The RFIC chip 140 may be electrically connected to the lateral antenna structure 124 through the redistribution circuit structure 270 and electrically connected to the antenna structure 116 through the redistribution circuit structure 170 and the through via 122. Accordingly, the lateral antenna structure 124 and the antenna structure 116 may generate an electromagnetic wave such as a microwave or receive a microwave from an external for the wireless communication function.

The conductive bump 280 may be disposed on the redistribution circuit structure 270 and electrically connected to the RFIC chip 140 through the redistribution circuit structure 270. The RFIC chip 140 may be electrically connected to the external device through the conductive bump 280. The redistribution circuit structure 270 may include a metal layer 272 and a dielectric layer 274. The dielectric layer 274 is disposed between the metal layer 272 and the conductive bump 280. The dielectric layer 274 may have an opening 274A exposing the metal layer 272, and the conductive bump 280 is disposed in the opening 274A and in contact with the metal layer 272. In some embodiments, the metal layer 272 in the redistribution circuit structure 270 though covered by the dielectric layer 274 may physically contact the conductive bump 280 without an interposing layer therebetween.

In accordance with some embodiments, a package structure may include an RFIC chip, a redistribution circuit structure, a backside redistribution circuit structure, an isolation film, a die attach film, and an insulating encapsulation. The redistribution circuit structure is disposed at a first side of the RFIC chip and electrically connected to the RFIC chip. The backside redistribution circuit structure is disposed at a second side of the RFIC chip and electrically connected to the RFIC chip through the redistribution circuit structure. The first side is opposite to the second side. The isolation film is disposed between the backside redistribution circuit structure and the RFIC chip. The die attach film is disposed between the RFIC chip and the isolation film. The insulating encapsulation encapsulates the RFIC chip and the isolation film between the redistribution circuit structure and the backside redistribution circuit structure. The isolation film may have a coefficient of thermal expansion lower than the insulating encapsulation and the die attach film. The isolation film may have a dissipation factor lower than the insulating encapsulation and the die attach film. The isolation film may have a thickness greater than the die attach film. An area of the isolation film exceeds an area of the RFIC chip. An isolation molding layer is disposed between the backside redistribution circuit structure and a plurality of antenna patches. The backside redistribution circuit structure may include a metal layer in contact with the isolation molding layer. A lateral antenna structure may be further located at a lateral side of the RFIC chip, encapsulated by the insulating encapsulation, and electrically connected to the RFIP chip through the redistribution circuit structure. A material of the isolation film comprises a pre-preg material. A material of the isolation film comprises at least one of fused quartz, polycarbonate, polystyrene, Teflon, and Tefzel. A conductive bump is further disposed on and electrically connected to the redistribution circuit structure. The redistribution circuit structure may include a metal layer and a dielectric layer, the dielectric layer is disposed between the metal layer and the conductive bump, the dielectric layer has an opening, and the conductive bump is disposed in the opening and in contact with the metal layer.

In accordance with alternative embodiments, a package structure may include an RFIC chip, a redistribution circuit structure, an antenna structure, an isolation film, a die attach film, and an insulating encapsulation. The redistribution circuit structure may be disposed at a first side of the RFIC chip and electrically connected to the RFIC chip. The antenna structure may be disposed at a second side of the RFIC chip and electrically connected to the RFIC chip through the redistribution circuit structure, wherein the first side is opposite to the second side. The isolation film may be disposed between the antenna structure and the RFIC chip. The die attach film may be disposed between the RFIC chip and the isolation film. The insulating encapsulation encapsulates the RFIC chip and the isolation film between the redistribution circuit structure and the antenna structure, wherein the isolation film has a dissipation factor lower than the insulating encapsulation and the die attach film. A material of the isolation film comprises a pre-preg material. A material of the isolation film comprises at least one of fused quartz, polycarbonate, polystyrene, Teflon, and Tefzel. A conductive bump may be further disposed on and electrically connected to the redistribution circuit structure. The redistribution circuit structure may include a metal layer and a dielectric layer. The dielectric layer is disposed between the metal layer and the conductive bump and has an opening. The conductive bump is in contact with the metal layer in the opening. The antenna structure may include a backside redistribution circuit structure, a plurality of antenna patches and an isolation molding layer disposed between the backside redistribution circuit structure and the antenna patches. The backside redistribution circuit structure is disposed on the insulating encapsulation and electrically connected to the RFIC chip through the redistribution circuit structure.

In accordance with alternative embodiments, a method of fabricating a package structure includes at least the following steps. A backside redistribution circuit structure is formed on a carrier. An isolation film is laminated on the backside redistribution circuit structure. An RFIC chip is attached on the isolation film through a die attach film, wherein the isolation film has a dissipation factor lower than the die attach film. A redistribution circuit structure is formed on the RFIC chip attached on the isolation film. The carrier is separated from the backside redistribution circuit structure. A plurality of antenna patches is formed over the backside redistribution circuit structure. An isolation molding layer is further formed between the backside redistribution circuit structure and the antenna patches. The method of forming the backside redistribution circuit structure on the carrier may include immediately forming a metal layer on the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
   a radio frequency integrated circuit (RFIC) chip;
   a redistribution circuit structure disposed at a first side of the RFIC chip and electrically connected to the RFIC chip;
   an antenna structure disposed at a second side of the RFIC chip and electrically connected to the RFIC chip through the redistribution circuit structure, wherein the first side is opposite to the second side, and the antenna structure comprises a backside redistribution circuit structure, a plurality of antenna patches and an isolation molding layer disposed between the backside redistribution circuit structure and the antenna patches, and wherein the isolation molding layer separates the backside redistribution circuit structure and the antenna patches by a dielectric gap;
   an isolation film disposed between the antenna structure and the RFIC chip;
   a die attach film disposed between the RFIC chip and the isolation film; and
   an insulating encapsulation encapsulating the RFIC chip and the isolation film between the redistribution circuit structure and the antenna structure, wherein the backside redistribution circuit structure is embedded in the insulating encapsulation.

2. The package structure of claim 1, wherein the isolation film has a dissipation factor lower than the insulating encapsulation and the die attach film.

3. The package structure of claim 1, wherein the isolation film has a thickness greater than the die attach film.

4. The package structure of claim 1, wherein an area of the isolation film exceeds an area of the RFIC chip.

5. The package structure of claim 1, wherein the backside redistribution circuit structure comprises a metal layer in contact with the isolation molding layer.

6. The package structure of claim 5, wherein the metal layer is in contact with the isolation film.

7. The package structure of claim 6, wherein an area of the metal layer further exceeds an area of the isolation film.

8. The package structure of claim 1, further comprising a lateral antenna structure located at a lateral side of the RFIC chip, encapsulated by the insulating encapsulation, and electrically connected to the RFIP chip through the redistribution circuit structure.

9. The package structure of claim 1, wherein a material of the isolation film comprises a pre-preg material.

10. The package structure of claim 1, wherein a material of the isolation film comprises at least one of fused quartz, polycarbonate, polystyrene, Teflon, and Tefzel.

11. The package structure of claim 1, further comprising a conductive bump disposed on and electrically connected to the redistribution circuit structure.

12. The package structure of claim 11, wherein the redistribution circuit structure comprises a metal layer and a dielectric layer, the dielectric layer is disposed between the metal layer and the conductive bump, the dielectric layer has an opening, and the conductive bump is in contact with the metal layer in the opening.

13. The package structure of claim 1, wherein-the backside redistribution circuit structure is electrically connected to the RFIC chip through the redistribution circuit structure.

14. The package structure of claim 1, further comprising a through via connected between the backside redistribution circuit structure and the redistribution circuit structure.

15. The package structure of claim 14, wherein the through via is encapsulated by the insulating encapsulation.

16. A method of fabricating a package structure comprising:
    forming a backside redistribution circuit structure on a carrier;
    laminating an isolation film on the backside redistribution circuit structure;
    attaching an RFIC chip on the isolation film through a die attach film, wherein the isolation film has a dissipation factor lower than the die attach film and the isolation film is disposed between the backside redistribution circuit structure and the RFIC chip;
    forming an insulating encapsulation encapsulating the RFIC chip, the die attach film and the isolation film, wherein the backside redistribution circuit structure is embedded in the insulating encapsulation;
    forming a front redistribution circuit structure on the RFIC chip attached on the isolation film, wherein the front redistribution circuit structure and the backside redistribution circuit structure are disposed at opposite sides of the RFIC chip;
    separating the carrier from the backside redistribution circuit structure;
    forming a plurality of antenna patches over the backside redistribution circuit structure, wherein the antenna patches and the backside redistribution circuit structure construct an antenna structure; and
    forming an isolation molding layer separating the backside redistribution circuit structure and the antenna patches by a dielectric gap.

17. The method of claim 16, wherein the method of forming the backside redistribution circuit structure on the carrier comprises immediately forming a metal layer on the carrier.

18. A package structure comprising:
    a radio frequency integrated circuit (RFIC) chip;
    a redistribution circuit structure disposed at a first side of the RFIC chip and electrically connected to the RFIC chip;
    an antenna structure disposed at a second side of the RFIC chip and electrically connected to the redistribution circuit structure, wherein the first side is opposite to the second side, and the antenna structure comprises a backside redistribution circuit structure, a plurality of antenna patches and an isolation molding layer, and wherein the isolation molding layer separates the backside redistribution circuit structure and the antenna patches by a dielectric gap;
    an isolation film disposed between the antenna structure and the RFIC chip; and
    an insulating encapsulation encapsulating the RFIC chip and the isolation film between the redistribution circuit structure and the backside redistribution circuit structure.

19. The package structure of claim 18, wherein the backside redistribution circuit structure comprises a metal layer in contact with the isolation film.

20. The package structure of claim 19, wherein an area of the metal layer further exceeds an area of the isolation film.

21. The package structure of claim 18, further comprising a lateral antenna structure located at a lateral side of the RFIC chip, encapsulated by the insulating encapsulation, and electrically connected to the RFIP chip through the redistribution circuit structure.

22. The package structure of claim 18, further comprising a through via connected between the backside redistribution circuit structure and the redistribution circuit structure.

* * * * *